(12) United States Patent
Shao et al.

(10) Patent No.: US 12,176,252 B2
(45) Date of Patent: Dec. 24, 2024

(54) METHOD AND DEVICE FOR PREDICTING INCLINATION ANGLE, AND METHOD AND DEVICE FOR MONITORING ETCHING DEVICE

(71) Applicant: CHANGXIN MEMORY TECHNOLOGIES, INC., Hefei (CN)

(72) Inventors: Bo Shao, Hefei (CN); Xinran Liu, Hefei (CN); Chunyang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 468 days.

(21) Appl. No.: 17/452,358

(22) Filed: Oct. 26, 2021

(65) Prior Publication Data

US 2022/0223479 A1 Jul. 14, 2022

Related U.S. Application Data

(63) Continuation of application No. PCT/CN2021/109887, filed on Jul. 30, 2021.

(30) Foreign Application Priority Data

Jan. 14, 2021 (CN) .................... 202110048239.6

(51) Int. Cl.
*H01L 21/66* (2006.01)
*G01B 11/22* (2006.01)

(52) U.S. Cl.
CPC .............. *H01L 22/12* (2013.01); *G01B 11/22* (2013.01); *H01L 22/30* (2013.01)

(58) Field of Classification Search
CPC ................................ G01B 11/22; H01L 22/30
See application file for complete search history.

(56) References Cited

U.S. PATENT DOCUMENTS

| | | | |
|---|---|---|---|
| 6,573,499 B1 | 6/2003 | Sasajima |
| 6,765,204 B2 | 7/2004 | Sasajima |
| 6,936,819 B2 | 8/2005 | Sasajima |
| 7,217,923 B2 | 5/2007 | Sasajima |
| 7,435,959 B2 | 10/2008 | Sasajima |
| 7,791,021 B2 | 9/2010 | Sasajima |
| 8,304,724 B2 | 11/2012 | Sasajima |
| 9,852,881 B2 | 12/2017 | Shishido et al. |

(Continued)

FOREIGN PATENT DOCUMENTS

| CN | 1628380 A | 6/2005 |
|---|---|---|
| CN | 109659246 A | 4/2019 |

(Continued)

*Primary Examiner* — Walter H Swanson
(74) *Attorney, Agent, or Firm* — Syncoda LLC; Feng Ma

(57) ABSTRACT

A method for predicting an inclination angle of an etched hole can include operations as follows. A preset change range of an etching rate of an etching device for an object to be etched on a surface of a monitored sample in different operation stages is determined. An etching rate change curve of the etching device for the object to be etched on the surface of a monitored sample in a current operation stage is acquired. When the etching rate change curve exceeds the preset change range, it is determined that an inclination angle of an etched hole of an etched product currently etched by the etching device exceeds a preset angle.

16 Claims, 19 Drawing Sheets

(56) References Cited

U.S. PATENT DOCUMENTS

| | | |
|---|---|---|
| 10,720,307 B2 | 7/2020 | Takagi et al. |
| 2003/0168596 A1 | 9/2003 | Sasajima |
| 2004/0217288 A1 | 11/2004 | Sasajima |
| 2005/0277029 A1 | 12/2005 | Sasajima |
| 2007/0290697 A1 | 12/2007 | Sasajima |
| 2008/0166842 A1 | 7/2008 | Lee |
| 2009/0020699 A1 | 1/2009 | Sasajima |
| 2010/0314541 A1 | 12/2010 | Sasajima |
| 2016/0379798 A1 | 12/2016 | Shishido et al. |
| 2018/0350614 A1* | 12/2018 | Liao .................. H01L 21/76 |
| 2019/0362933 A1 | 11/2019 | Takagi et al. |

FOREIGN PATENT DOCUMENTS

| | | |
|---|---|---|
| CN | 110024074 A | 7/2019 |
| CN | 112713113 A | 4/2021 |

* cited by examiner

METHOD AND DEVICE FOR PREDICTING INCLINATION ANGLE, AND METHOD AND DEVICE FOR MONITORING ETCHING DEVICE

CROSS-REFERENCE TO RELATED APPLICATIONS

This is a continuation of International Patent Application No. PCT/CN2021/109887 filed on Jul. 30, 2021, which claims priority to Chinese Patent Application No. 202110048239.6 filed on Jan. 14, 2021. The disclosures of the above-referenced applications are hereby incorporated by reference in their entirety.

BACKGROUND

With the continuous development of semiconductor technologies, the performance requirements for capacitors in semiconductor integrated circuits are getting higher. For example, the storage amount of data is increased with the improvement of the integration of the capacitors.

SUMMARY

The disclosure relates to the technical field of integrated circuits, and in particular to a method and device for predicting an inclination angle of an etched hole, a method and device for monitoring an etching device.

According to a first aspect of the disclosure, a method for predicting an inclination angle of an etched hole is provided. The method includes operations as follows. A preset change range of an etching rate of an etching device for an object to be etched on a surface of a monitored sample in different operation stages is determined. An etching rate change curve of the etching device for an object to be etched on a surface of a monitored sample in a current operation stage is monitored. When the etching rate change curve exceeds the preset change range, it is determined that an inclination angle of an etched hole of an etched product etched by the etching device exceed a preset angle.

According to a second aspect of the disclosure, a method for monitoring an etching device is provided. The method includes operations as follows. Whether an inclination angle of an etched hole of an etched product exceeds a preset angle according to the above method for monitoring an inclination angle of the etched hole. When the inclination angle of the etched hole exceeds the preset angle, alarm information is sent to an etching device.

According to a third aspect of the disclosure, a device for predicting an inclination angle of an etched hole is provided, which includes a processor, and a memory configured to store executable instructions of the processor. The processor is configured to execute the executable instructions to: determine a preset change range of an etching rate of an etching device for an object to be etched on a surface of a monitored sample in different operation stages; acquire an etching rate change curve of the etching device for an object to be etched on a surface of a monitored sample in a current operation stage; and determine, when the etching rate change curve exceeds the preset change range, that an inclination angle of an etched hole of an etched product etched by the etching device exceed a preset angle.

According to a fourth aspect of the disclosure, a device for monitoring an etching device is provided, which includes a processor, an input/output (I/O) interface, and a memory configured to store executable instructions of the processor. The processor is configured to execute the executable instructions to: determine whether an inclination angle of an etched hole of an etched product exceeds a preset angle according to the above method for monitoring an inclination angle of the etched hole; and control the I/O interface to send alarm information to an etching device when the inclination angle of the etched hole exceeds the preset angle.

It should be understood that the above general description and the following detailed description are merely exemplary and explanatory, and are not intended to limit the disclosure.

BRIEF DESCRIPTION OF THE DRAWINGS

The accompanying drawings are incorporated in and constitute a part of the description, illustrate embodiments conforming to the disclosure and, together with the description, serve to explain the principles of the disclosure. It is apparent that the accompanying drawings in the following description show only some embodiments of the disclosure, and a person of ordinary skill in the art may still derive other accompanying drawings from these accompanying drawings without creative efforts.

DETAILED DESCRIPTION

Figure 1:
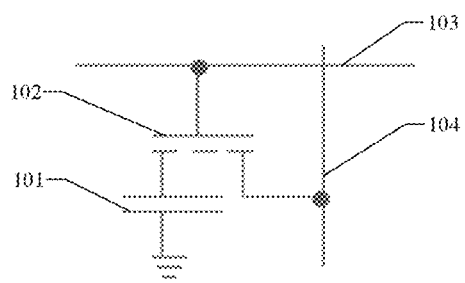
FIG. 1 is a schematic structural diagram of memory cells of a DRAM.

Exemplary embodiments are now described more comprehensively with reference to the accompanying drawings. However, the exemplary embodiments can be implemented in a plurality of forms, and shall not be understood to be limited to the examples described herein. Instead, these embodiments are provided to make the disclosure comprehensive and complete, and convey the concept of the exemplary embodiments to persons skilled in the art. The same reference numerals in the accompanying drawings represent the same or similar structures, and therefore are not described in detail.

Although relative terms such as "upper" and "lower" are used in the description to describe a relation of one component in relative to another component denoted by the reference numeral, these terms are used in the description only for convenience, for example, according to the exemplary directions in the accompanying drawings. It can be understood that if the device denoted by the reference numeral is turned over and turned upside down, the component described as being "upper" becomes the "lower" component. Other relative terms, such as "high", "low", "top", "bottom", "left", and "right" also have similar meanings. When a certain structure is located "on" other structures, it may mean that a certain structure is integrally formed on other structures, or a certain structure is "directly" disposed on other structure, or a certain structure is "indirectly" disposed on other structures through another structure.

The terms "one", "a/an" and "the" are used to mean that there are one or more elements/components, or the like. The terms "comprise" and "has/have" are used to indicate open-ended inclusion, and mean that there may be additional elements/components, or the like other than the listed elements/components, or the like.

In order to improve the integration of the capacitors, the capacitors are usually arranged in a vertical state. However, the capacitor on a side edge of a wafer is prone to incline along with abrasion of an etching device, which may result in failure or even collapse of the inclined capacitor.

In order to monitor an inclination angle of a capacitor hole, a Scanning Electron Microscope (SEM) is usually used to measure the inclination angle of the capacitor. However, the measurement cost of this method is high, and the real-time performance of the measurement is poor.

In a DRAM integrated circuit device, a memory cell array is typically arranged in rows and columns, so that a particular memory cell can be addressed by specifying a row and a column of the array. A word line connects memory cells at the row with read amplifiers of a bit line of data in a set of detection units. Subsequently, in a read operation, selection or "column selection" is performed on a subset of data in the read amplifier for output.

Referring to FIG. 1, which shows a schematic structural diagram of memory cells of a DRAM, in FIG. 1, each memory cell in the DRAM generally includes a capacitor 101 and a transistor 102. The gate of the transistor 102 is connected to a word line 103, the drain of the transistor is connected to a bit line 104, and the source of the transistor is connected to the capacitor 101. A voltage signal on the word line 103 can control the transistor 102 to be turned on or off, and then data information stored in the capacitor 101 can be read through the bit line 104, or the data information is written into the capacitor 101 through the bit line 104 for storage. The DRAM mainly stores data in the form of charge stored in the capacitor 101.

For a DRAM chip provided with multiple memory cells, the charges stored in the capacitor increases with the increase of the height of the capacitor. In addition, in a case that the height of the capacitor is fixed, the number of capacitors formed in the existing area increases with improvement of the integration of capacitors. Therefore, the total number of charges stored in the capacitors in the entire DRAM chip can also be increased, thereby increasing the amount of data that can be stored. For example, in a case that the capacitors are designed to be in a vertical state, the integration of the capacitors can be improved while ensuring the sufficient height of the capacitors, thereby increasing the total amount of data stored in the capacitors.

Figure 2:
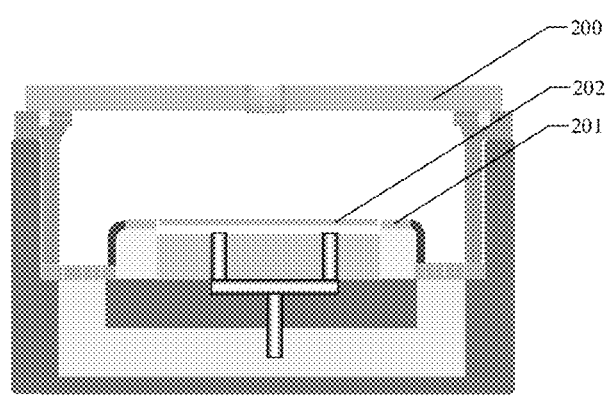
FIG. 2 is a schematic cross-sectional diagram of an etching device.

As the height of the capacitors increases, the difficulty of processing capacitors on the wafer increases, and the quality of the processed capacitors also reduces. In order to improve the processing efficiency and quality, a focus ring 201 is usually added in the etching device 200 as shown in FIG. 2. The focus ring 201 is disposed on the periphery of a wafer 202 in an etching cavity to limit the etching area of the wafer 202, so as to ensure that the plasmas used to bombard the wafer 202 operate in an effective region.

Figure 3:
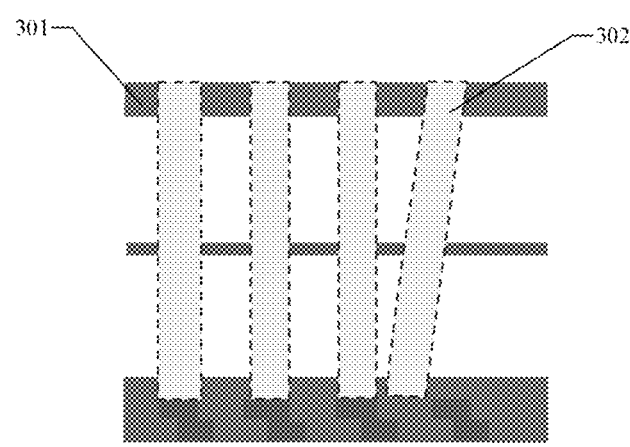
FIG. 3 is a schematic structural diagram of an inclined capacitor on a side edge of a wafer.
Figure 4:
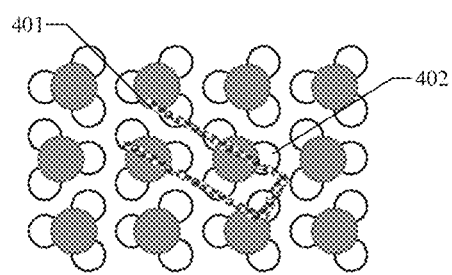
FIG. 4 is a schematic structural diagram of a collapsed capacitor on a side edge of a wafer.

However, after the etching device operates for a period of time, especially after the focus ring is abraded, the plasmas which are close to a side edge of the wafer and are used to bombard the wafer overflow from a position where the focus ring is abraded and cause loss. In this case, the plasmas close to the inside move to the side edge to compensate for the lost plasmas on the side edge. This causes the plasmas which are close to the side edge of the wafer and are used to bombard the wafer to generate a lateral velocity, and further causes the etched capacitor to be inclined. That is, the capacitor 302 on the side edge of the wafer 301 as shown in FIG. 3 is inclined. The inclined capacitor 302 may fail because the capacitor cannot be docked to a pad. Even when the inclination degree is great, the capacitor 302 may collapse and short-circuit the surrounding capacitors. For example, a capacitor 401 shown in FIG. 4 collapses on the surrounding capacitors 402.

Figure 5:
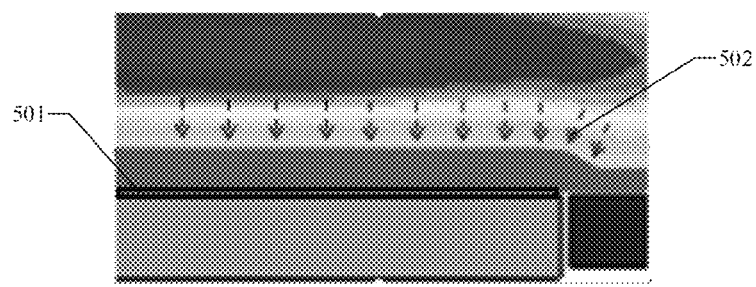
FIG. 5 is an ion distribution diagram of plasmas in an initial operation stage of an etching device.
Figure 6:
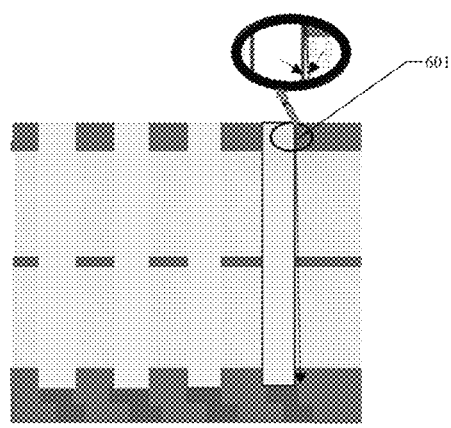
FIG. 6 schematically shows capacitor holes bombarded by the plasmas corresponding to FIG. 5 and a partial enlarged view of the capacitor holes.
Figure 7:
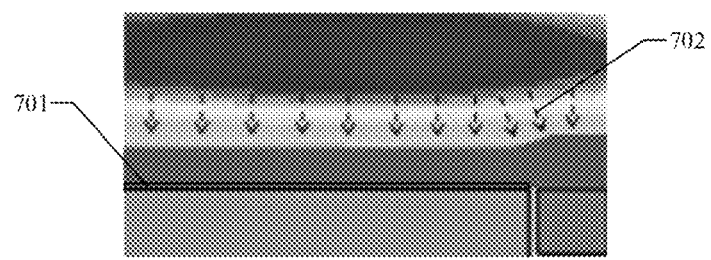
FIG. 7 is an ion distribution diagram of plasmas in a later operation stage of an etching device.
Figure 8:
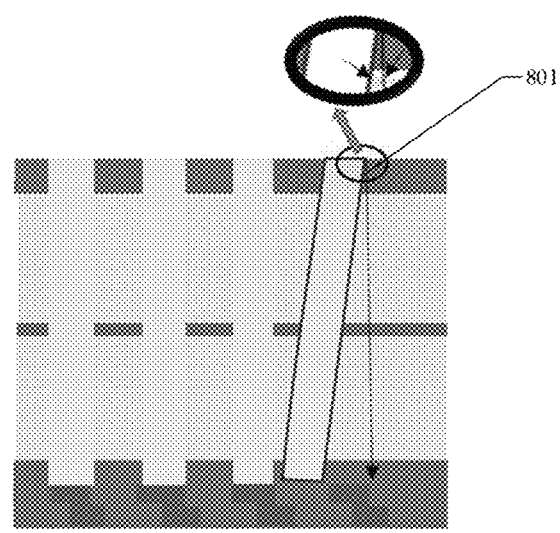
FIG. 8 schematically shows capacitor holes bombarded by the plasmas corresponding to FIG. 7 and a partial enlarged view of the capacitor holes.

Referring to FIG. 5, FIG. 5 shows an ion distribution diagram of plasmas under a condition that a focus ring is not abraded in an initial operation stage of an etching device. FIG. 6 shows capacitor holes 601 bombarded by the plasmas corresponding to FIG. 5 and a partial enlarged view of the capacitor holes 601. Referring to FIG. 7, FIG. 7 shows an ion distribution diagram of plasmas under a condition that a focus ring is abraded in a later operation stage of an etching device. FIG. 8 shows capacitor holes bombarded by the plasmas corresponding to FIG. 7 and a partial enlarged view of capacitor holes. Comparing FIG. 7 with FIG. 5, it can be seen that the plasmas 502 at the side edge used to bombard the wafer 501 in FIG. 5 all face toward the wafer 501. However, the plasmas 702 at the side edge used to bombard the wafer 701 in FIG. 7 have a tendency to move outward (shown by the arrow in FIG. 7). That is, the plasmas at the side edge generate a lateral velocity, which causes that an inclination angle of a capacitor hole 801 at the side edge bombarded by the plasmas as shown in FIG. 8 is significantly greater than the inclination angle of the capacitor hole 601 at the side edge as shown in FIG. 6.

Figure 9:
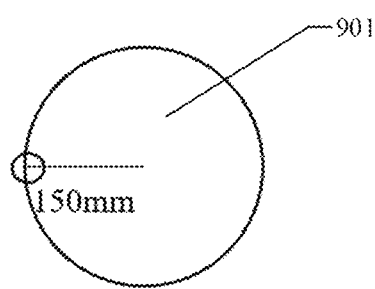
FIG. 9 is a schematic cross-sectional diagram of a wafer.

It is to be noted that a region of the side edge mentioned above may be a peripheral region of the wafer 901 with a distance of 120 mm from the center of the wafer as shown in FIG. 9. The length of the distance from the center of the wafer may be determined according to actual situations, which is not limited in this exemplary embodiment.

Based on the description that the capacitor hole is inclined, in an etching process, detecting the inclination angle of the capacitor hole etched by the etching device has become a necessary step in the existing etching process. However, if the etched product is cut directly and the inclination angle of the capacitor hole is detected, the cost is high, and it is not possible to help monitoring the device in advance and accurately control the time to replace the focus ring.

Moreover, in the prior art, the inclination angle of the capacitor hole is detected through scanning electron microscope (SEM). Since the depth of the capacitor hole is generally much greater than the width thereof, it is necessary to use a special imaging mode with a high aspect ratio to capture SEM images. However, implementation using this imaging mode is time-consuming and expensive, and it cannot help determining when to accurately replace the focus ring.

On this basis, in order to reduce the probability of inclination of the capacitor on the side edge of the wafer, in the wafer etching process, an appropriate time to replace the focus ring is determined, to avoid waste due to premature replacement and avoid from producing defective products due to too-late replacement, thereby reducing the processing cost while ensuring the processing quality of capacitor. The exemplary embodiments of the disclosure provide a method for predicting an inclination angle of an etched hole, to achieve the purpose of predicting the inclination angle of the etched hole of the currently etched product in real time, and provide a basis for the operation and maintenance time of the etching device.

Figure 10:
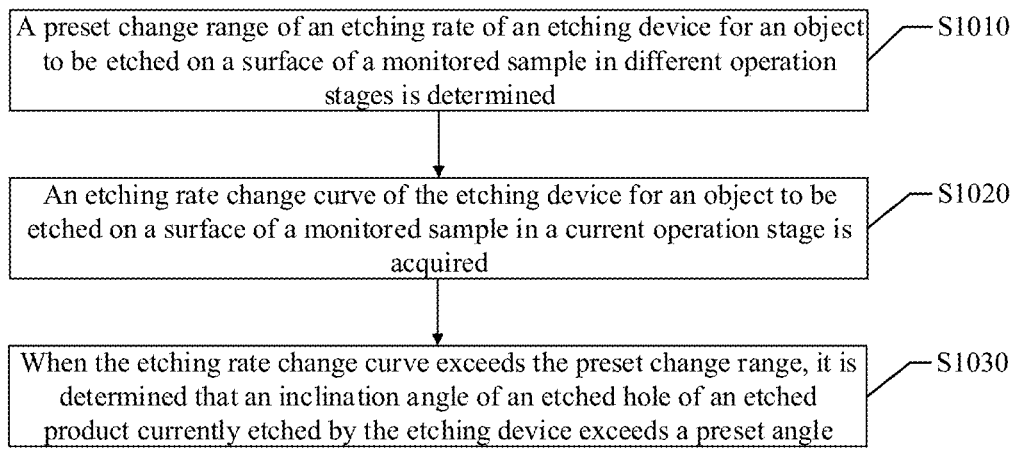
FIG. 10 is a flowchart of a method for predicting an inclination angle of an etched hole according to an exemplary embodiment of the disclosure.

Referring FIG. 10, FIG. 10 shows a flowchart of a method for predicting an inclination angle of an etched hole according to an exemplary embodiment of the disclosure. As shown in FIG. 10, the method for predicting an inclination angle of an etched hole applied to an etching device may include the following operations.

At S1010, a preset change range of an etching rate of an etching device for an object to be etched on a surface of a monitored sample in different operation stages is determined.

At S1020, an etching rate change curve of the etching device for the object to be etched on a surface of a monitored sample in a current operation stage is acquired.

At S1030, when the etching rate change curve exceeds the preset change range, it is determined that an inclination angle of an etched hole of an etched product currently etched by the etching device exceed a preset angle.

A movement direction of plasmas on the side edge of the wafer changes when the focus ring is abraded, and the change may lead to a change in the etching rate of the etching device, and the change in the etching rate may also lead to a change in the inclination angle of the etched hole such as the capacitor hole. Therefore, according to the method for predicting an inclination angle of an etched hole in the exemplary embodiments of the disclosure, an inclination angle of the etched hole of the etched product is predicted by detecting the etching rate for the object to be etched on the surface of the monitored sample. In this way, it is possible to accurately predict whether the inclination angle is within a preset angle range, thereby guiding actual production. Moreover, because the etching rate for the object to be etched on the surface of the monitored sample is a detection quantity which is easy to be obtained, the method for predicting an inclination angle of an etched hole in the exemplary embodiment of the disclosure is easy to implement and low in cost, and can achieve the purpose of predicting the inclination angle of the etched hole of the currently etched product in real time, and can thus provide a reliable basis for determining the operation and maintenance time of the etching device.

Hereinafter, the method for predicting an inclination angle of an etched hole in this exemplary embodiment is described in detail in two different embodiments.

First Embodiment

Operation S1010 that the preset change range of the etching rate of the etching device for the object to be etched on the surface of the monitored sample in different operation stages is determined includes operations as follows. The monitored sample and an etched sample are etched by the etching device under the same etching condition in the different operation stages. The etched sample and the monitored sample have the same structural size. A time-varying curve of the etching rate for the object to be etched on the surface of the monitored sample is acquired. An inclination angle of the etched hole in the etched sample is detected. In a case that the inclination angle is less than or equal to the preset angle, the preset change range is determined according to the time-varying curve of the etching rate.

In this exemplary embodiment, the monitored sample and the etched sample are etched separately by the etching device under the same etching condition in different operation stages. The structural size of the monitored sample is the same as the structural size of the etched sample, and is also the same as the structural size of the etched product. Since the etched sample and the etched product are made of the same material and are both composed of complex multilayer structures. Therefore, it is difficult to acquire the etching rate of the etched sample. Moreover, the surface of the monitored sample is covered with a thick layer of object to be etched. Under the same etching condition, the etching rate for the object to be etched on the surface of the monitored sample can be easily monitored. Since the etching condition of the etched sample is the same as the etching condition of the monitored sample, the etching condition reflected by the etching rate for the object to be etched on the surface of the monitored sample are also the etching condition of the etched sample.

In practical applications, the object to be etched on the surface of the monitored sample may be one or more of oxides, nitrides and organic silicide, which are not limited in this exemplary embodiment.

By acquiring the time-varying curves of the etching rate for the object to be etched on the surface of the monitored sample in the different operation stages, the entire etching rate of the etching device in the entire operation stage, that is, a time period between two adjacent maintenance nodes, can be acquired to achieve the purpose of quantification. Therefore, a standard can be established for the entire operation stage, thereby facilitating monitoring the etching device.

Since the etching device may process different batches of etched products during the entire operation stage, in order to save the cost and time of acquiring the etching rate in this exemplary embodiment, focus rings with the same abrasion degree may be used on the same etching device to simultaneously etch the etched sample and the monitored sample, to meet the requirements of the same etching condition. In addition, focus rings with different abrasion degrees are used simultaneously on the same etching device to etch multiple pairs of etched samples and monitored samples, to acquire etching rates of the etching device corresponding to the focus rings with different abrasion degrees during different operation periods in the entire operation stage. Therefore, a relationship between the abrasion degrees of the focus rings and the etching rates can be established. Moreover, since the abrasion degree of the focus ring is directly related to the inclination angle of the etched hole, the relationship between the etching rates and the inclination angles of the etched holes can be established through the abrasion degrees of the focus rings.

After the etching for the etched sample is completed, the inclination angle of the etched hole in the etched sample is measured. Regarding the specific measurement method, reference can be made to an existing SEM method in which the etched sample is cut to obtain an SEM image, and the inclination angle of the etched hole is determined. Since the abrasion of the focus ring mainly affects the etched hole on the side edge of the etched sample, the inclination angle of the etched hole on the side edge of the SEM image of the etched sample is measured, to obtain a maximum inclination angle of the etched hole of the etched sample.

In the exemplary embodiments of the disclosure, an etched sample in which a maximum inclination angle of the etched hole is less than or equal to a preset angle among etched samples is determined as a qualified product, and the preset change range is determined according to the time-varying curve of the etching rate obtained in the etching process of the qualified product. Therefore, a range of qualified product processed by the etching device in the entire operation stage can be determined.

It is to be noted that in the exemplary embodiment of the disclosure, although the SEM image is used to measure the inclination angle, only a limited number of etched samples are measured to obtain the preset change range of the etching rate, i.e., to establish a standard. In the subsequent process of determining the inclination angle of the etched hole of the etched product, there is no need to obtain the SEM image for the etched product, thereby saving economic cost and time cost to a large extent.

In practical applications, in order to save resources to the greatest extent and determine an appropriate time to replace a focus ring, an etched sample in which the maximum inclination angle of the etched hole is approximate to or equal to the preset angle is determined, and the time-varying curve of the etching rate obtained in the etching process of the etched sample is determined as the preset change range. The preset angle can be determined according to actual situations, which is not limited in this exemplary embodiment.

The operation that the preset change range is determined according to the time-varying curve of the etching rate includes operations as follows. A maximum etching rate curve and a minimum etching rate curve are determined on the basis of the time-varying curve of the etching rate. A region between the maximum etching rate curve and the minimum etching rate curve is determined as the preset change range. For example, the minimum etching rate curve can be determined in a mirroring mode with taking the corresponding time-varying curve of the etching rate for the object to be etched on the surface of the monitored sample when the inclination angle of the etched sample is approximate to the preset angle as the maximum etching rate curve and taking an average etching rate as a reference, that is, the preset change range is obtained. This exemplary embodiment does not limit the specific manner of determining the preset change range.

In this exemplary embodiment, the surface of the monitored sample can be divided into different regions, and the etched holes in the etched sample can also be divided into etched holes in different regions. Therefore, the time-varying curves of the etching rates of the etching device corresponding to the etched holes in the different regions of the etched sample in the operation stage are obtained by region to determine the preset change range. The inclination angles of all the etched holes are detected in real time by region, so that other situations of the etching device except the abrasion degree of the focus ring can also be monitored, thereby improving the accuracy of monitoring the etching device and increasing the processing yield of device.

Figure 11:
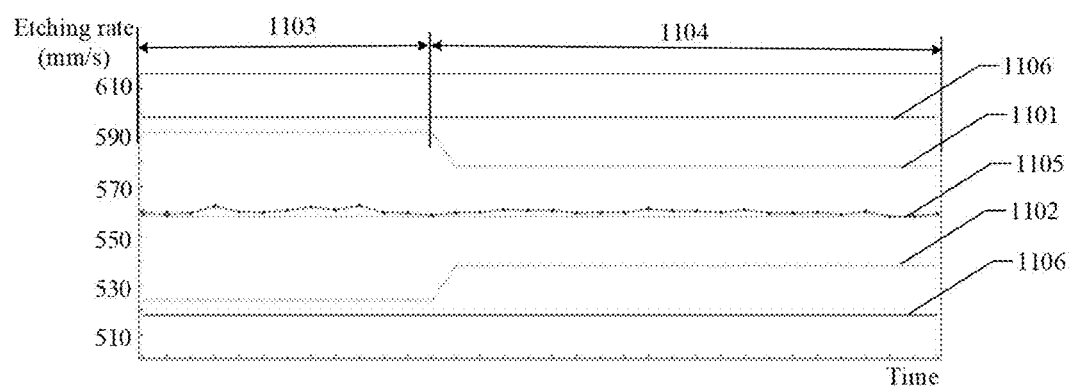
FIG. 11 schematically shows a time-varying graph of an etching rate in a center region of a wafer in a method for predicting an inclination angle of an etched hole according to an exemplary embodiment of the disclosure.
Figure 12:
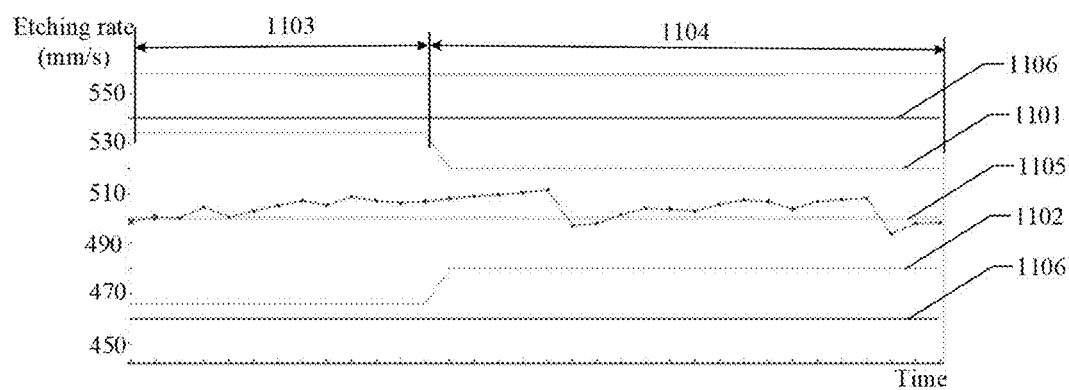
FIG. 12 schematically shows a time-varying curve of an etching rate in a side edge region of the wafer in a method for predicting an inclination angle of an etched hole according to an exemplary embodiment of the disclosure.
Figure 13:
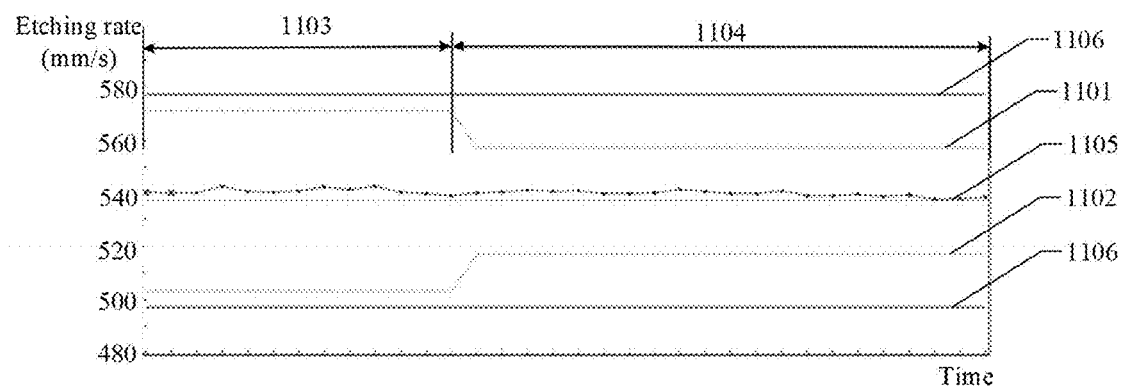
FIG. 13 schematically shows a time-varying curve of an etching rate in a region close to the center of the wafer in a method for predicting an inclination angle of an etched hole according to an exemplary embodiment of the disclosure.
Figure 14:
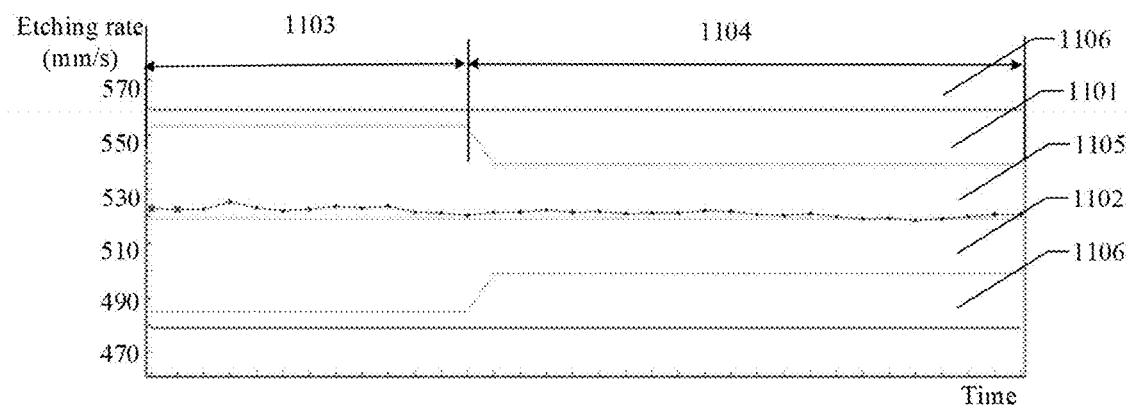
FIG. 14 schematically shows a time-varying curve of the etching rate in a region close to the side edge of the wafer in a method for predicting an inclination angle of an etched hole according to an exemplary embodiment of the disclosure.

The different regions are further described with taking a wafer as an example. In a case that the etched sample is a wafer, the different regions on the surface of the monitored sample include at least one of a center region, a side edge region, a region close to the center, or a region close to the side edge. The preset change range is determined through the etched holes in the above-mentioned different regions and the time-varying curves of the etching rates, and the obtained maximum etching rate curve 1101 and minimum etching rate curve 1102 of a certain type of wafer in the above-mentioned different regions are shown in FIG. 11 to FIG. 14. FIG. 11 corresponds to the center region, FIG. 12 corresponds to the side edge region, FIG. 13 corresponds to the region close to the center, and FIG. 14 corresponds to the region close to the side edge.

Optionally, in this exemplary embodiment, the determined preset change range of the etching rate may be 450-600 nm/s for the wafer.

Furthermore, as shown in FIG. 11 to FIG. 14, different preset change ranges can be set for the different regions of the wafer according to actual situations. For example, over the operation time, the operation stage can also be divided into a first operation interval 1103 and a second operation interval 1104. The preset change range of the center region in the first operation interval 1103 is 520-590 nm/s. The preset change range of the center region in the second operation interval 1104 is 540-580 nm/s. The preset change range of the side edge region in the first operation interval 1103 is 460-540 nm/s. The preset change range of the side edge region in the second operation interval 1104 is 480-520 nm/s. The preset change range of the region close to the center in the first operation interval 1103 is 500-580 nm/s. The preset change range of the region close to the center in the second operation interval 1104 is 520-560 nm/s. The preset change range of the region close to the side edge in the first operation interval 1103 is 480-560 nm/s. The preset change range of the region close to the side edge in the second operation interval 1104 is 500-540 nm/s. The preset change ranges can be determined more accurately through the different operation intervals. The ranges of the different operation intervals can be determined according to actual situations, which are not limited in this exemplary embodiment.

In S1020, after the preset change range is obtained, the etching rate change curve of the etching device for an object to be etched on a surface of a monitored sample in the current operation stage can be acquired.

The surface of the monitored sample is formed by laying the object to be etched, thereby facilitating the acquisition of the etching rate on the surface of the monitored sample. For example, the etching rate can be determined according to the remaining thickness of the object to be etched reserved after etching. In this exemplary embodiment, the acquired etching rate change curve for the object to be etched on the surface of the monitored sample in the current operation stage is shown as the curve 1105 in FIG. 11 to FIG. 14.

It is to be noted that the monitored sample in different operation stages in S1010 is a monitored sample used for establishing the preset change range standard. Moreover, the monitored sample in the current operation stage in S1020 is a monitored sample used when the etching device detects a device by using the monitored sample in a normal operation process.

In S1030, the etching rate change curve can be compared with the preset change range, and when the etching rate change curve exceeds the preset change range, it is determined that the inclination angle of the etched hole of the etched product that is etched currently exceeds the preset angle. This indicates that the current etched hole is excessively inclined, and the abrasion degree of the focus ring in the operation interval is excessively large, and the focus ring needs to be replaced. When the inclination angle of the current etched hole exceeds the preset angle, the focus ring of the etching device is replaced.

Similarly, the region corresponding to the current etched hole can also be determined, and the etching rate change curve in a region is compared with preset change range in the same region, thereby improving the monitoring accuracy. For example, if the region corresponding to the current etched hole is the center region, the etching rate change curve of the etched hole is compared with the preset change range in FIG. 11. If the region corresponding to the current etched hole is the side edge region, the etching rate change curve of the etched hole is compared with the preset change range in FIG. 12. If the region corresponding to the current etched hole is the region close to the center, the etching rate change curve of the etched hole is compared with the preset change range in FIG. 13. If the region corresponding to the current etched hole is the region close to the side edge, the etching rate change curve of the etched hole is compared with the preset change range in FIG. 14. The specific regions are not limited in this exemplary embodiment.

In practical applications, a cut-off line 1106 can be set in the curve shown in FIG. 11 to FIG. 14. If the etching rate change curve of the current etched hole exceeds the cut-off line 1106, it can be determined that a comprehensive inspection is required for the etching device to ensure the normal operation of the etching device. A position of the cut-off line 1106 can be determined with reference to the preset change range, for example, a distance from the preset change range is 20 mm/s, etc., which is not limited in this exemplary embodiment.

In a first exemplary embodiment, the preset change range of the etching rate is obtained on the basis of the time-varying curve of the etching rate for the object to be etched on the surface of the monitored sample, and the inclination angle of the etched hole is determined according to the etching rate change curve of the object to be etched on the surface of the monitored sample in the current operation stage. In a second exemplary embodiment, the preset change range of the etching rate as well as the etching rate change curves at different etching positions on the surface of the current monitored sample are obtained on the basis of the etching rates at different etching positions on the surface of the monitored sample and a change curve of a relative distance of the etching position, which are described in detail as follows.

Second Embodiment

Figure 15:
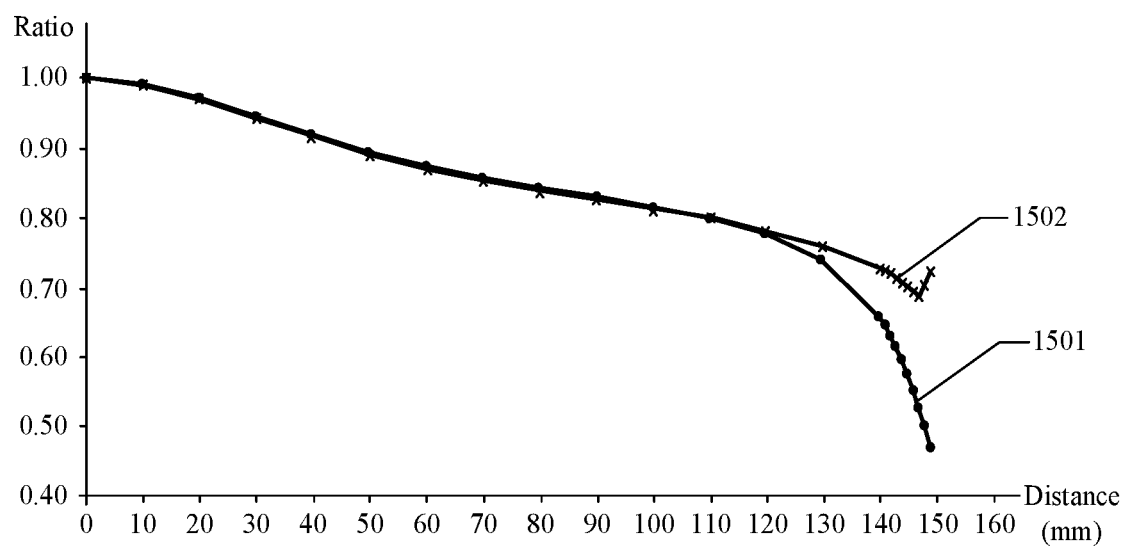
FIG. 15 is a schematic diagram of a change curve of etching rates at different etching positions on a surface of a monitored sample with a distance between the etching positions according to an exemplary embodiment of the disclosure.

Referring to FIG. 15, FIG. 15 shows a schematic diagram of a change curve of etching rates at different etching positions on the surface of the monitored sample with a relative distance of the etching position according to an exemplary embodiment of the disclosure. The operation S1010 that a preset change range of an etching rate of an etching device for an object to be etched on a surface of a monitored sample in different operation stages is determined includes operations as follows.

First ratios of the etching rates of the etching device for the objects to be etched at different etching positions on the surface of the monitored sample in an initial operation stage to a first reference etching rate are acquired. A first preset ratio distance change curve 1501 is determined according to the first ratios and distances from the different etching positions on the surface of the monitored sample to a center position of the monitored sample. The first reference etching rate is an average etching rate at the center position of the monitored sample in the initial operation stage.

In practical application, the abrasion degree of the focus ring is small in the initial operation stage. Therefore, the inclination angle of the etched hole of the etched sample is also small. For example, a maximum inclination angle of the etched hole corresponding to the first preset ratio distance change curve 1501 in FIG. 15 is 1 degree. The preset change range may be determined by taking the first preset ratio distance change curve 1501 as the lower limit.

Second ratios of the etching rates of the etching device for the object to be etched at different etching positions on the surface of the monitored sample in a later operation stage to a second reference etching rate are acquired. A second preset ratio distance change curve 1502 is determined according to the second ratios and distances from the different etching positions on the surface of the monitored sample to a center position of the monitored sample. The second reference etching rate is an average etching rate at the center position of the monitored sample in the later operation stage.

In practical applications, in the later operation stage, the abrasion degree of the focus ring is large. Therefore, the inclination angle of the etched hole of the etched sample is large. For example, a maximum inclination angle of the etched hole corresponding to the second preset ratio distance change curve 1502 in FIG. 15 is 5 degrees. The preset change range may be determined by taking the second preset ratio distance change curve 1502 as the upper limit.

The inclination angle of the etched hole in the etched sample in the later operation stage is detected. In a case that the inclination angle is less than or equal to the preset angle, the preset change range is determined according to the first preset ratio distance change curve and the second preset ratio distance change curve. The reason that only the inclination angle of the etched hole in the etched sample at the later operation stage is detected is that: as long as the inclination angle in the later operation stage is less than or equal to the preset angle, the inclination angle in the initial operation stage is necessarily less than the preset angle. Therefore, the preset change range can be determined by taking the first preset ratio distance change curve 1501 as the lower limit and taking the second preset ratio distance change curve 1502 as the upper limit.

In practical applications, the preset angle can be set according to actual situations, e.g., 5 degrees, which is not limited in this exemplary embodiment.

In S1020, after the preset change range is obtained, the etching rate change curve of the etching device for the object to be etched on the surface of the monitored sample in the current operation stage can be acquired.

The operation S1020 may include operations as follows. Third ratios of the etching rates for the object to be etched at the different etching positions on the surface of the current monitored sample to a third reference etching rate are determined. The etching rate change curve is determined according to the third ratios and distances from the different etching positions on the surface of the current monitored sample to the center position of the monitored sample. The third reference etching rate is an average etching rate at the center position of the current monitored sample.

It is to be noted that the monitored sample in different operation stages in S1010 is a monitored sample used when establishing the preset change range standard. Moreover, the monitored sample in the current operation stage in S1020 is a monitored sample used when the etching device detects the device by using the monitored sample in a normal operation process.

In S1030, the currently acquired etching rate change curve can be compared with the preset change range, and when the etching rate change curve exceeds the preset change range, it is determined that the inclination angle of the etched hole of the etched product currently etched by the etching device exceeds the preset angle. This indicates that the current etched hole is inclined, and the abrasion degree of the focus ring in the operation interval is large, and the focus ring needs to be replaced. When the inclination angle of the current etched hole exceeds the preset angle, the focus ring of the etching device is replaced.

In this exemplary embodiment, when the etching rate change curve of the third ratios with the distance exceeds the first preset ratio distance change curve and the second preset ratio distance change curve, it is determined that the inclination angle of the current etched hole exceeds the preset angle.

According to the method for predicting an inclination angle of the etched hole provided in the exemplary embodiments of the disclosure, the preset change range is determined through two different implementation modes. In practical applications, the both modes can be used, or either one of the modes can be used, which is not limited in this exemplary embodiment.

Figure 16:
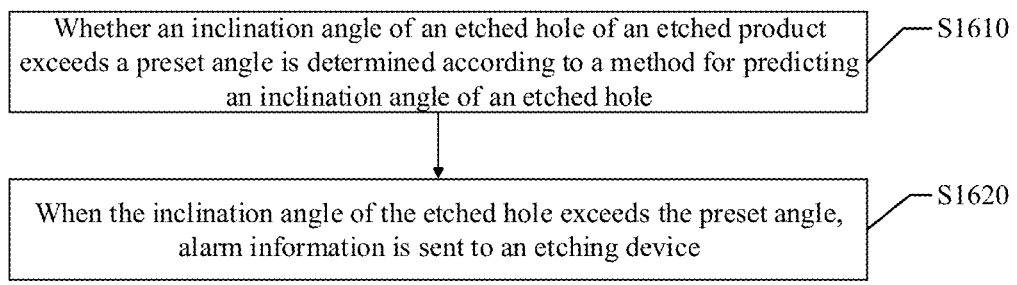
FIG. 16 is a flowchart of a method for monitoring an etching device according to an exemplary embodiment of the disclosure.

Referring to FIG. 16, FIG. 16 shows a flowchart of a method for monitoring an etching device according to an exemplary embodiment of the disclosure. As shown in FIG. 16, the method includes operations as follows.

At S1601, whether an inclination angle of an etched hole of an etched product exceeds a preset angle is determined according to the method for predicting an inclination angle of the etched hole.

At S1602, when the inclination angle of the etched hole exceeds the preset angle, alarm information is sent to an etching device.

According to the method for monitoring an etching device provided in this exemplary embodiment, when the inclination angle of the etched hole exceeds the preset angle, it can be determined that the abrasion degree of a focus ring is large, and the focus ring needs to be replaced. In this case, the alarm information is sent to an etching device, to inform the staff to inspect the etching device, replace the focus ring or repair the etching device.

Specifically, determining whether inclination angle of the etched hole exceeds a preset angle according to the above method for predicting an inclination angle of an etched hole has been described in detail in the foregoing embodiments, and is not repeated here.

It is to be noted that the operations of the method in the disclosure are described in the particular order. However, this does not require or suggest that these operations are executed in the particular order, or all of the operations should be executed to achieve the desired result. Additionally or optionally, some operations may be omitted, multiple operations are combined into one operation for execution, and/or one operation is divided into a plurality of operations for execution, etc.

Figure 17:
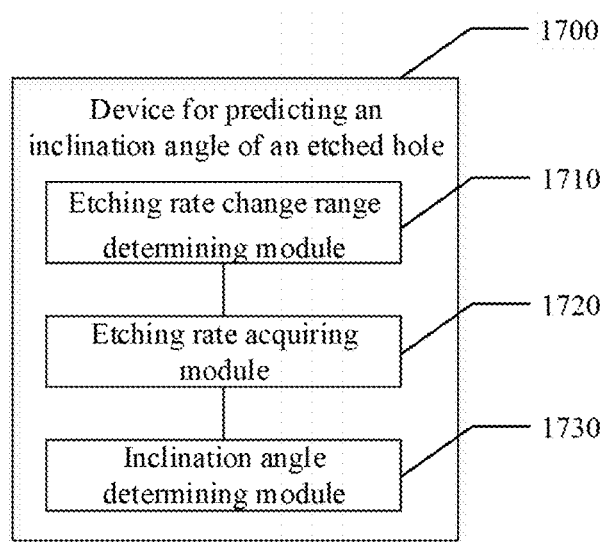
FIG. 17 is a block diagram of a device for predicting an inclination angle of an etched hole according to an exemplary embodiment of the disclosure.

In addition, in this exemplary embodiment, a device for predicting an inclination angle of an etched hole is also provided. Referring to FIG. 17, the device 1700 for predicting an inclination angle of an etched hole may include an etching rate change range determining module 1710, an etching rate acquiring module 1720, and an inclination angle determining module 1730.

The etching rate change range determining module 1710 is configured to determine a preset change range of an etching rate of an etching device for an object to be etched on a surface of a monitored sample in different operation stages.

The etching rate acquiring module 1720 is configured to acquire an etching rate change curve of the etching device for an object to be etched on a surface of a monitored sample in a current operation stage.

The inclination angle determining module 1730 is configured to determine, when the etching rate change curve exceeds the preset change range, that an inclination angle of an etched hole of an etched product currently etched by the etching device exceed a preset angle.

The details of virtual modules of the device for predicting an inclination angle of an etched hole have been described in detail in the corresponding method for predicting an inclination angle of an etched hole, and thus are be repeated here.

Figure 18:
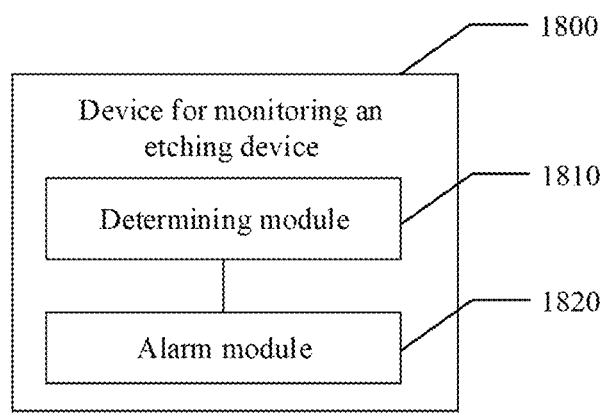
FIG. 18 is a block diagram of a device for monitoring an etching device according to an exemplary embodiment of the disclosure.

In addition, in this exemplary embodiment, a device for monitoring an etching device is also provided. Referring to FIG. 18, the device 1800 for monitoring an etching device may include a determining module 1810 and an alarm module 1820.

The determining module 1810 is configured to determine, according to the above method for predicting an inclination angle of an etched hole, whether an inclination angle of an etched hole of an etched product exceed a preset angle. Moreover, the specific details of the method for predicting an inclination angle of an etched hole in the foregoing embodiment have been described in detail in the method for predicting an inclination angle of an etched hole, and therefore are not repeated here.

The alarm module 1820 is configured to send, when the inclination angle of the etched hole exceeds the preset angle, alarm information to an etching device.

In practical applications, the alarm information can be sent by means of text alarm, voice alarm etc., which is not particularly limited in this exemplary embodiment.

It is to be noted that in the detailed description above, several modules or units of the device for predicting an inclination angle of an etched hole and the device for monitoring an etching device are mentioned, but this division is not mandatory. In practice, according to the embodiments of the disclosure, the features and functions of two or more modules or units described above may be embodied in one module or unit. Conversely, the feature and function of one module or unit described above can be further divided into multiple modules or units to be embodied.

An electronic device capable of implementing the foregoing method is also provided in the exemplary embodiments of the disclosure.

Persons skilled in the art could understand that the various aspects of the disclosure can be implemented as a system, a method or a program product. Accordingly, the various aspects of the disclosure may be implemented in the form of an entirely hardware embodiment, an entirely software embodiment (including firmware, micro-code, etc.) or an embodiment combining software and hardware, which may all generally be referred to herein as a "circuit", "module" or "system".

The electronic device 1900 according to this embodiment of the disclosure is described below with reference to FIG. 19. The electronic device 1900 shown in FIG. 19 is merely an example and is not intended to limit the functionality and the application scope of the embodiments of the disclosure described herein.

Figure 19:
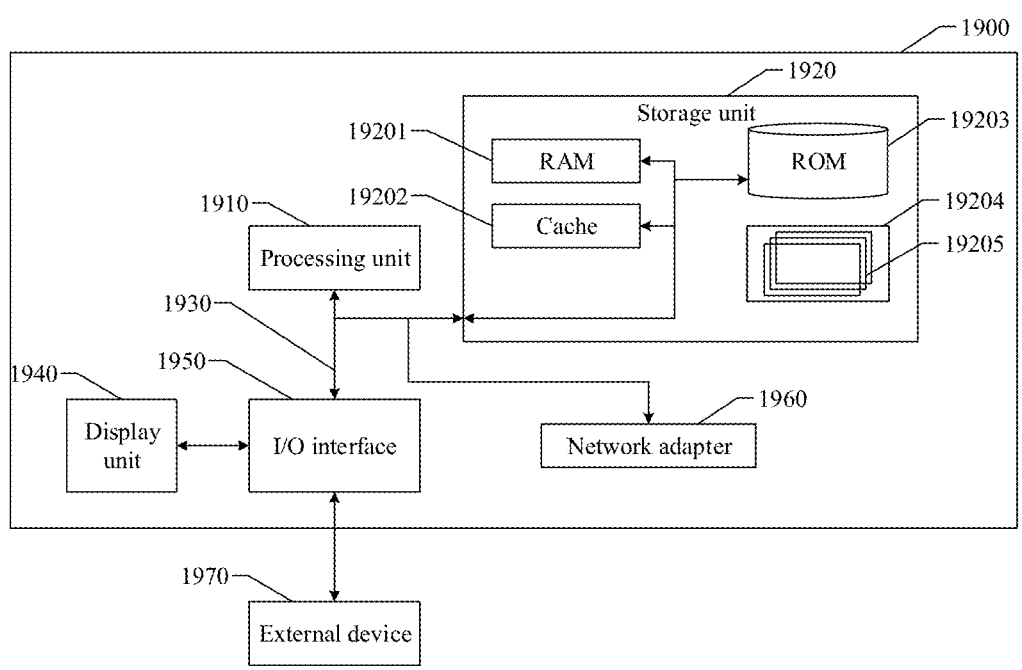
FIG. 19 is a schematic diagram of modules of an electronic device according to an exemplary embodiment of the disclosure.

As shown in FIG. 19, the electronic device 1900 is expressed in the form of a general computing device. Components of the electronic device 1900 may include but are not limited to the at least one processing unit 1910, the at least one storage unit 1920, a bus 1930 for connecting different system components (including the storage unit 1920 and the processing unit 1910), and a display unit 1940.

The storage unit 1920 stores a program code, which can be executed by the processing unit 1910, so that the processing unit 1910 executes the operations according to various exemplary embodiments of the disclosure described in the foregoing "Exemplary Method" section of this specification. For example, the processing unit 1910 may execute the following operations S1010 to S1030 as shown in FIG. 10. At S1010, a preset change range of an etching rate of an etching device in an operation stage is determined. The operation stage refers to a time period between two adjacent maintenance nodes of the etching device. At S1020, the etching rate change curve of a current etched hole is determined. At S1030, when the etching rate change curve exceeds the preset change range, it is determined that the inclination angle of the current etched hole exceeds a preset angle. Alternately, the processing unit may execute the following operations S1610 to S1620 as shown in FIG. 16. At S1610, whether an inclination angle of an etched hole exceeds a preset angle is determined according to the foregoing method for predicting an inclination angle of an etched hole. At S1620, when the inclination angle of the etched hole exceeds the preset angle, alarm information is sent to an etching device.

The storage unit 1920 may include a readable medium in the form of a volatile storage unit, such as a random access memory (RAM) 19201 and/or a cache storage unit 19202, and may further include a read-only memory (ROM) 19203.

The storage unit 1920 may further include a program/utility tool 19204 having a set of (at least one) program modules 19205. Such program modules 19205 include, but are not limited to: an operating system, one or more application programs, other program modules, and program data. Each or some combinations in these examples may include the implementation of a network environment.

The bus 1930 may represent one or more of several types of bus structures, including a storage unit bus or a storage unit controller, a peripheral bus, a graphics acceleration port, a processing unit, or a local bus using any of a variety of bus structures.

The electronic device 1900 can also communicate with one or more external devices 1970 (such as keyboards, pointing devices, and Bluetooth devices), may further communicate with one or more devices that enable a user to interact with the electronic device 1900, and/or any device (such as a router and a Modem) that enables the electronic device 1900 to communicate with one or more other computing devices. Such communication can be performed through an input/output (I/O) interface 1950. Moreover, the electronic device 1900 may also communicate with one or more networks (such as, a local area network (LAN), a wide area network (WAN), and/or a public network, such as the Internet) through a network adapter 1960. As shown in FIG. 19, the network adapter 1960 communicates with other modules of the electronic device 1900 through the bus 1930. It is to be understood that although not shown in FIG. 19, other hardware and/or software modules can be used in conjunction with the electronic device 1900, and the other hardware and/or software modules include but are not limited to: microcode, device drivers, redundant processing units, external disk drive arrays, RAID systems, tape drives, and data backup storage systems, etc.

Through the description of the above embodiments, persons skilled in the art can easily understand that the exemplary embodiments described herein can be implemented by software, or can be implemented by combining software with necessary hardware. Therefore, the technical solution according to the embodiments of the disclosure can be embodied in the form of a software product. The software product can be stored in a non-volatile storage medium (which may be a CD-ROM, a U disk, a mobile hard disk, etc.) or on the network, and includes several instructions to enable a computing device (which may be a personal computer, a server, a terminal device, or a network device, etc.) to execute the method according to the embodiments of the disclosure.

In the exemplary embodiments of the disclosure, a computer-readable storage medium having stored thereon a program product is also provided, and the program product is capable of implementing the foregoing method in this specification. In some possible embodiments, the various aspects of the disclosure may be further implemented in a form of a program product including program code. When the program product is run on a terminal device, the program code is used to enable the terminal device to execute the operations according to various exemplary embodiments of the disclosure described in the foregoing "Exemplary Method" section of this specification.

The program product for implementing the foregoing method according to the embodiments of the disclosure may adopt a portable compact disk read-only memory (CD-ROM) and include a program code, and can be run on a terminal device, such as a personal computer. However, the program product of the disclosure is not limited thereto. In this document, the readable storage medium may be any tangible medium that contains or stores a program, and the program may be used by or in combination with an instruction execution system, apparatus, or device.

The program product may be any combination of one or more readable mediums. The readable medium may be a readable signal medium or a readable storage medium. The readable storage medium may be, for example, but is not limited to, an electric, magnetic, optical, electromagnetic, infrared, or semi-conductive system, apparatus, or device, or any combination thereof. More specific examples of the readable storage medium (a non-exhaustive list) include: an electrical connection having one or more wires, a portable disk, a hard disk, a random access memory (RAM), a read-only memory (ROM), an erasable programmable ROM (EPROM or a flash memory), an optical fiber, a portable compact disc ROM (CD-ROM), an optical storage device, a magnetic storage device, or any appropriate combination thereof.

The computer-readable signal medium may include a data signal propagated in baseband or as a part of a carrier, and a readable program code is carried on the computer-readable signal medium. This propagated data signal may be in multiple forms, including but not limited to electromagnetic signals, optical signals, or any suitable combination thereof. The readable signal medium may also be any readable medium other than a readable storage medium. The readable medium can send, propagate, or transmit the program used by or in combination with the instruction execution system, apparatus, or device.

The program code contained on the readable medium can be transmitted by any suitable medium, including but not limited to wireless, wired, optical cable, RF, etc., or any suitable combination thereof.

Program code for executing operations of the disclosure may be written in any combination of one or more programming languages, including an object oriented programming language such as Java, C++ or the like and conventional procedural programming languages, such as the "C" programming language or similar programming languages. The program code may be executed entirely on the user's computing device, partly on user equipment, or executed as a stand-alone software package, or partly on the user's computing device and partly on a remote computing device, or entirely on the remote computing device or server. In the scenario involving the remote computing device, the remote computing device may be connected to the user's computing device through any type of network, including a local area network (LAN) or a wide area network (WAN), or may be connected to an external computing device (for example, through the Internet using an Internet service provider).

In addition, the above-mentioned drawings are merely schematic illustrations of the processing included in the method according to the exemplary embodiments of the disclosure, and are not intended for limitation. It is easy to understand that the processing shown in the above drawings does not indicate or limit the time sequence of the processing. In addition, it is also easy to understand that the processing can be, for example, executed synchronously or asynchronously in multiple modules.

Person skilled in the art could easily conceive of other embodiments of the disclosure after considering the specification and practicing the invention disclosed here. This application is intended to cover any variations, functions, or adaptive changes of the disclosure. These variations, functions, or adaptive changes conforms to general principles of the disclosure, and include common general knowledge or common technical means in the technical field that are not disclosed in the disclosure. The specification and embodiments are merely considered to be exemplary, and the actual scope and spirit of the disclosure are pointed out in the claims.

It is to be understood that the disclosure is not limited to a precise structure that has been described above and shown in the accompanying drawings, and various modifications and changes can be made without departing from the scope thereof. The scope of the disclosure is limited only by the appended claims.

What is claimed is:

1. A method for predicting an inclination angle of an etched hole, comprising:
   determining a preset change range of an etching rate of an etching device for an object to be etched on a surface of a monitored sample in different operation stages;
   acquiring an etching rate change curve of the etching device for the object to be etched on the surface of a monitored sample in a current operation stage; and
   responsive to that the etching rate change curve exceeds the preset change range, determining that an inclination angle of an etched hole of an etched product etched by the etching device exceeds a preset angle.

2. The method of claim 1, wherein the determining the preset change range of the etching rate of the etching device for the object to be etched on the surface of the monitored sample in different operation stages comprises:
   etching the monitored sample and an etched sample under a same etching condition of the etching device in the different operation stages, wherein the etched sample and the monitored sample have a same structural size;
   acquiring a time-varying curve of the etching rate for the object to be etched on the surface of the monitored sample;
   detecting a maximum inclination angle of the etched hole in the etched sample; and
   responsive to that the maximum inclination angle is less than or equal to the preset angle, determining the preset change range according to the time-varying curve of the etching rate.

3. The method of claim 2, wherein the determining the preset change range according to the time-varying curve of the etching rate comprises:
   setting a maximum etching rate curve and a minimum etching rate curve with taking the time-varying curve of the etching rate as a reference; and
   determining a region between the maximum etching rate curve and the minimum etching rate curve as the preset change range.

4. The method of claim 2, wherein the object to be etched on the surface of the monitored sample is one or more of oxides, nitrides, and organic silicide.

5. The method of claim 2, wherein the etched hole in the etched sample comprises etched holes of the etched sample in different regions.

6. The method of claim 5, wherein the acquiring the time-varying curve of the etching rate for the object to be etched on the surface of the monitored sample comprises:
   acquiring time-varying curves of etching rates for objects to be etched in different regions on the surface of the monitored sample.

7. The method of claim 6, wherein in a case that the etched sample is a wafer, the different regions on the surface of the monitored sample comprise at least one of a center region, a side edge region, a region close to a center or a region close to a side edge.

8. The method of claim 5, wherein in a case that the etched sample is a wafer, the different regions on the surface of the monitored sample comprise at least one of a center region, a side edge region, a region close to a center or a region close to a side edge.

9. The method of claim 8, wherein the determined preset change range of the etching rate ranges from 450 to 600 nm/s.

10. The method of claim 1, wherein the determining the preset change range of the etching rate of the etching device for the object to be etched on the surface of the monitored sample in different operation stages comprises:
  acquiring first ratios of the etching rates of the etching device for the objects to be etched at different etching positions on the surface of the monitored sample in an initial operation stage to a first reference etching rate;
  determining a first preset ratio distance change curve according to the first ratios and distances from the different etching positions on the surface of the monitored sample to the center position of the monitored sample;
  acquiring second ratios of the etching rates of the etching device for the objects to be etched at the different etching positions on the surface of the monitored sample in a later operation stage to a second reference etching rate;
  determining a second preset ratio distance change curve according to the second ratios and the distances from the different etching positions on the surface of the monitored sample to the center position of the monitored sample;
  detecting inclination angles of etched holes at the different etching positions of an etched sample in the later operation stage, wherein the etched sample and the monitored sample have a same structural size; and
  in a case that the inclination angles are less than or equal to the preset angle, determining the preset change range according to the first preset ratio distance change curve and the second preset ratio distance change curve.

11. The method of claim 10, wherein the acquiring the etching rate change curve of the etching device for the object to be etched on the surface of the monitored sample in the current operation stage comprises:
  determining third ratios of etching rates at the different etching positions on a surface of a current monitored sample to a third reference etching rate; and
  determining the etching rate change curve according to the third ratios and the distances from the different etching positions on the surface of the current monitored sample to the center position of the monitored sample.

12. The method of claim 11, wherein the first reference etching rate is an average etching rate at the center position on the surface of the monitored sample in the initial operation stage;
  the second reference etching rate is an average etching rate at the center position on the surface of the monitored sample in the later operation stage; and
  the third reference etching rate is an average etching rate at the center position on the surface of the current monitored sample.

13. The method of claim 1, wherein the preset angle is 5 degrees.

14. The method of claim 1, further comprising:
  responsive to that the inclination angle of the etched hole exceeds the preset angle, replacing a focus ring of the etching device.

15. A method for monitoring an etching device, comprising:
  determining whether an inclination angle of an etched hole of an etched product exceeds a preset angle according to the method for predicting an inclination angle of an etched hole of claim 1; and
  responsive to that the inclination angle of the etched hole exceeds the preset angle, sending alarm information to an etching device.

16. A device for monitoring the etching device implementing the method for predicting the inclination angle of the etched hole of claim 1, the device comprising:
  a processor;
  an input/output interface; and
  a memory configured to store executable instructions of the processor,
  wherein the processor is configured to execute the executable instructions to:
  determine whether the inclination angle of the etched hole of an etched product exceeds the preset angle; and
  responsive to that the inclination angle of the etched hole exceeds the preset angle, control the input/output interface to send alarm information to the etching device.

* * * * *